United States Patent
Lee

(10) Patent No.: US 9,514,801 B1
(45) Date of Patent: Dec. 6, 2016

(54) SEMICONDUCTOR DEVICE GENERATING A REFRESH SIGNAL

(71) Applicant: SK hynix Inc., Icheon-si Gyeonggi-do (KR)

(72) Inventor: Hyeng Ouk Lee, Yongin-si (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/041,828

(22) Filed: Feb. 11, 2016

(30) Foreign Application Priority Data

Oct. 5, 2015 (KR) .................. 10-2015-0139722

(51) Int. Cl.
*G11C 7/10* (2006.01)
*G11C 11/406* (2006.01)
*G11C 11/4076* (2006.01)
*G11C 11/4093* (2006.01)

(52) U.S. Cl.
CPC ...... *G11C 11/40626* (2013.01); *G11C 11/4076* (2013.01); *G11C 11/4093* (2013.01)

(58) Field of Classification Search
CPC . G11C 7/1051; G11C 7/1078; G11C 7/1087; G11C 11/40626; G11C 11/406; G11C 11/40615

USPC .................................. 365/189.05, 222, 211
See application file for complete search history.

(56) References Cited

U.S. PATENT DOCUMENTS

2006/0023545 A1   2/2006   Ito et al.
2009/0022002 A1*  1/2009   Sako .................. G11C 11/406
                                                        365/212

FOREIGN PATENT DOCUMENTS

KR      1020070074327 A      7/2007

* cited by examiner

*Primary Examiner* — Huan Hoang
(74) *Attorney, Agent, or Firm* — William Park & Associates Ltd.

(57) ABSTRACT

A semiconductor device includes a temperature code latch circuit and a period selection circuit. The temperature code latch circuit latches a count code having a logic level combination corresponding to an internal temperature to output the latched count code as a temperature code. The period selection circuit selects a period of a refresh signal in response to the temperature code. A period variation rate of the refresh signal according to variation of the internal temperature is controlled by a first gradient selection signal in a first temperature section and is controlled by a second gradient selection signal in a second temperature section.

26 Claims, 11 Drawing Sheets

SEMICONDUCTOR DEVICE GENERATING A REFRESH SIGNAL

CROSS-REFERENCE TO RELATED APPLICATIONS

The present application claims priority under 35 U.S.C §119(a) to Korean Patent Application No. 10-2015-0139722, filed on Oct. 5, 2015, in the Korean Intellectual Property Office, which is incorporated herein by reference in its entirety as set forth in full.

BACKGROUND

1. Technical Field

Embodiments of the present disclosure relate to semiconductor device generating a refresh signal.

2. Related Art

A semiconductor system including a semiconductor device may need a periodic signal to control internal operations thereof. That is, the semiconductor system may execute the internal operations in response to the periodic signal generated in the semiconductor system or from an external device. The periodic signal may include pulses which are created to have a uniform cycle. Thus, the periodic signal may be used to execute iterative internal operations of integrated circuits ICs constituting the semiconductor device.

Volatile memory devices, for example dynamic random access memory (DRAM) devices, may lose their stored data as time elapses even though their power supplies are continuously provided. Thus, all memory cells in the DRAM devices should be refreshed within a data retention time corresponding to a maximum time that the memory cells can retain data. Since the refresh operation is periodically executed, the DRAM devices may need a periodic signal to execute the refresh operation.

An operation speed of the semiconductor devices may vary according to a temperature. That is, the higher the temperature, the slower the operation speed of the semiconductor devices. In contrast, the lower the temperature, the faster the operation speed of the semiconductor devices. If the operation speed of the semiconductor device varies according to the temperature, the reliability of the semiconductor devices may be degraded to the point of causing a malfunction.

BRIEF DESCRIPTION OF THE DRAWINGS

Various embodiments of the present disclosure will become more apparent in view of the attached drawings and accompanying detailed description, in which.

DETAILED DESCRIPTION OF THE EMBODIMENTS

Various embodiments are directed to semiconductor devices generating a refresh signal.

According to an embodiment, a semiconductor device includes a temperature code latch circuit and a period selection circuit. The temperature code latch circuit latches a count code having a logic level combination corresponding to an internal temperature to output the latched count code as a temperature code. The period selection circuit selects a period of a refresh signal in response to the temperature code. A period variation rate of the refresh signal according to variation of the internal temperature is controlled by a first gradient selection signal during a first temperature section and is controlled by a second gradient selection signal during a second temperature section.

According to another embodiment, a semiconductor device includes a gradient control circuit and a period selection circuit. The gradient control circuit compares a count code with first to fourth set codes to generate first and second gradient selection signals, in response to a temperature detection signal, a first selection control signal and a second selection control signal. The period selection circuit selects a period of a refresh signal in response to a temperature code. A period variation rate of the refresh signal according to variation of an internal temperature is controlled by the first gradient selection signal during a first temperature section and is controlled by the second gradient selection signal during a second temperature section.

According to another embodiment, a semiconductor device includes a temperature code latch circuit and a period selection circuit. The temperature code latch circuit latches a count code having a logic level combination corresponding to an internal temperature to output the latched count code as a temperature code. The period selection circuit selects a period of a control signal in response to the temperature code. A period variation rate of the control signal according to variation of the internal temperature is controlled by a first gradient selection signal during a first temperature section and is controlled by a second gradient selection signal during a second temperature section Various embodiments of the present disclosure will be described hereinafter with reference to the accompanying drawings. However, the embodiments described herein are for illustrative purposes only and are not intended to limit the scope of the present disclosure.

Figure 1:
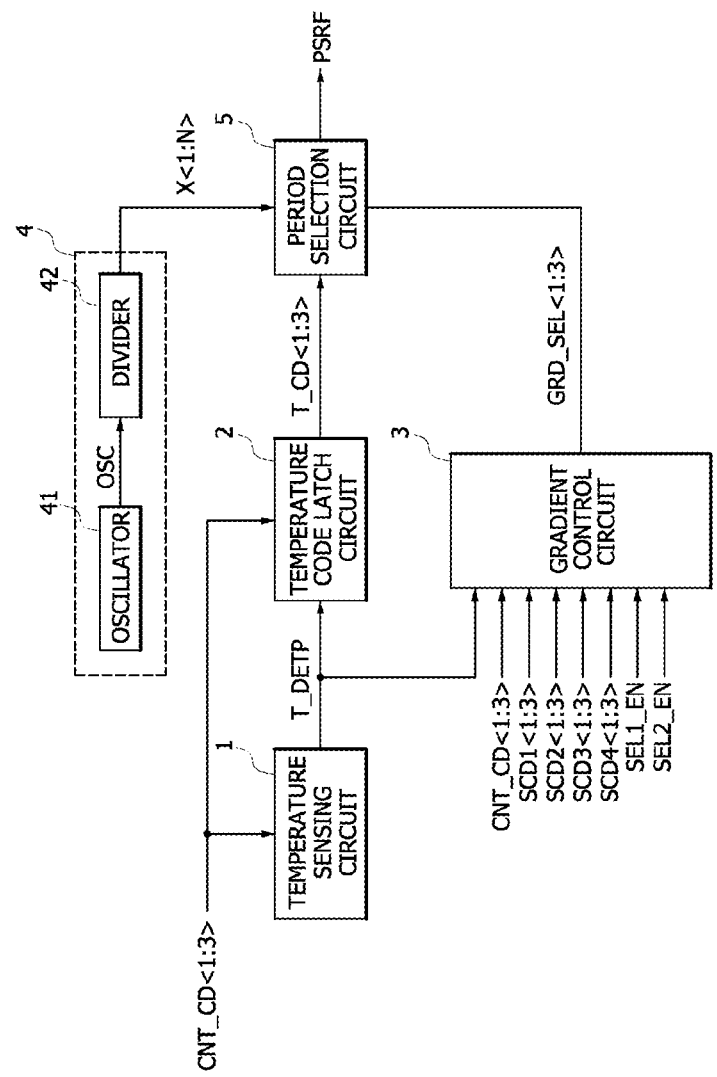
FIG. 1 is a block diagram illustrating a semiconductor device according to an embodiment.

As illustrated in FIG. 1, a semiconductor device according to an embodiment may include a temperature sensing circuit 1, a temperature code latch circuit 2, a gradient control circuit 3, a periodic signal generation circuit 4, and a period selection circuit 5.

The temperature sensing circuit 1 may generate a temperature detection signal T_DETP in response to a count code CNT_CD<1:3>. The count code CNT_CD<1:3> may be a signal that is sequentially counted and may be provided by an external device or generated in the semiconductor device. A logic level combination of the count code CNT_CD<1:3> may correspond to an internal temperature of the semiconductor device. For example, if the count code CNT_CD<1:3> is sequentially counted from a logic level combination of '000' to a logic level combination of '111', the logic level combination of '000' may mean that the semiconductor device has an internal temperature of 120 degrees Celsius, the logic level combination of '011' may mean that the semiconductor device has an internal temperature of 96 degrees Celsius, and the logic level combination of '110' may mean that the semiconductor device has an internal temperature of 30 degrees Celsius. The temperature sensing circuit 1 may include a temperature sensor (not shown) that senses the internal temperature of the semiconductor device. The temperature sensing circuit 1 may generate the temperature detection signal T_DETP including a pulse generated if the count code CNT_CD<1:3>, having a logic level combination corresponding to the internal temperature of the semiconductor device, is input to the temperature sensing circuit 1.

The temperature code latch circuit 2 may generate a temperature code T_CD<1:3> from the count code CNT_CD<1:3> in response to the temperature detection signal T_DETP. More specifically, the temperature code latch circuit 2 may latch the count code CNT_CD<1:3> to output the latched count code as the temperature code T_CD<1:3>, in synchronization with a time point that a pulse of the temperature detection signal T_DETP is generated. That is, the temperature code latch circuit 2 may latch the count code CNT_CD<1:3> having a logic level combination corresponding to the internal temperature of the semiconductor device to output the latched count code as the temperature code T_CD<1:3>.

The gradient control circuit 3 may compare the count code CNT_CD<1:3> with first to fourth set codes SCD1<1:3>, SCD2<1:3>, SCD3<1:3> and SCD4<1:3> to generate first to third gradient selection signals GRD_SEL<1:3>, in response to the temperature detection signal T_DETP, a first selection control signal SEL1_EN and a second selection control signal SEL2_EN. More specifically, the gradient control circuit 3 may compare the count code CNT_CD<1:3> with the first and second set codes SCD1<1:3> and SCD2<1:3> to generate a first internal signal (INI1 of FIG. 3) and may generate the first gradient selection signal GRD_SEL<1> from the first internal signal INI1 in synchronization with the pulse of the temperature detection signal T_DETP while the first selection control signal SEL1_EN is enabled. In addition, the gradient control circuit 3 may compare the count code CNT_CD<1:3> with the third and fourth set codes SCD3<1:3> and SCD4<1:3> to generate a second internal signal (INI2 of FIG. 4). The gradient control circuit 3 may generate the second gradient selection signal GRD_SEL<2> from the second internal signal INI2 in synchronization with a pulse of the temperature detection signal T_DETP while the second selection control signal SEL2_EN is enabled. Moreover, the gradient control circuit 3 may generate the third gradient selection signal GRD_SEL<3> in response to the first and second gradient selection signals GRD_SEL<1:2>. Logic levels of the first and second selection control signals SEL1_EN and SEL2_EN are enabled and may be set different according to the embodiments.

The periodic signal generation circuit 4 may include an oscillator 41 and a divider 42. The oscillator 41 may generates an oscillation signal OSC corresponding to a periodic signal. The divider 42 may divide the oscillation signal OSC to generate first to $N^{th}$ divided signals X<1:N>. A period (i.e., a cycle time) of the oscillation signal OSC may be set different depending on the embodiment. A period of each of the first to $N^{th}$ divided signals X<1:N> may be set to be an integer number times that of the oscillation signal OSC. For example, a period of the $K^{th}$ divided signal X<K> may be set to be "K" times that of the oscillation signal OSC. The number "N" of the first to $N^{th}$ divided signals X<1:N> may be set different according to the embodiment.

The period selection circuit 5 may output one of the first to $N^{th}$ divided signals X<1:N> as a refresh signal PSRF in response to at least one of the temperature code T_CD<1:3> and the first to third gradient selection signals GRD_SEL<1:3>. The period selection circuit 5 may generate the refresh signal PSRF whose period is reduced as the internal temperature of the semiconductor device falls. A temperature gradient (i.e., a period of a decreasing rate of the refresh signal PSRF according to a decrease in the internal temperature of the semiconductor device) may be controlled in accordance with the first to third gradient selection signals GRD_SEL<1:3>. For example, the temperature gradient may be set to a maximum value if the first gradient selection signal GRD_SEL<1> is enabled, and the temperature gradient may be set to a minimum value if the third gradient selection signal GRD_SEL<3> is enabled.

Figure 2:
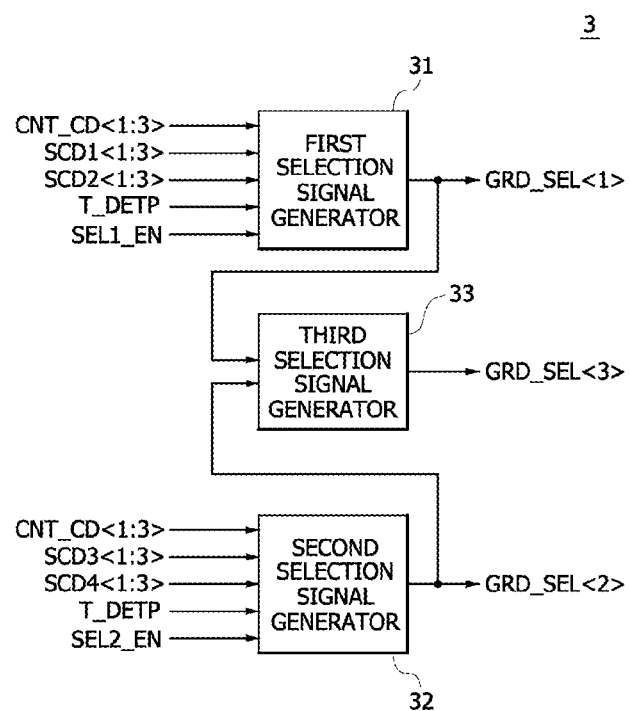
FIG. 2 is a block diagram illustrating a gradient control circuit included in the semiconductor device of FIG. 1.

Referring to FIG. 2, the gradient control circuit 3 may include a first selection signal generator 31, a second selection signal generator 32 and a third selection signal generator 33.

The first selection signal generator 31 may generate an enabled first gradient selection signal GRD_SEL<1> from the count code CNT_CD<1:3> and the first and second set codes SCD1<1:3> and SCD2<1:3> in response to the first selection control signal SEL1_EN and the temperature detection signal T_DETP. In one example, the first gradient selection signal GRD_SEL<1> may be enabled synchronously with a time that the count code CNT_CD<1:3> is the same as the first set code SCD1<1:3>. In another example, the first selection signal generator 31 may compare the count code CNT_CD<1:3> with the first and second set codes SCD1<1:3> and SCD2<1:3> to generate the first internal signal (INI1 of FIG. 3), and the first selection signal generator 31 may generate the first gradient selection signal GRD_SEL<1> from the first internal signal INI1 in synchronization with the pulse of the temperature detection signal T_DETP while the first selection control signal SEL1_EN is enabled. Further, the first gradient selection signal GRD_SEL<1> may be disabled when the count code CNT_CD<1:3> is the same as the second set code SCD2<1:3>.

The second selection signal generator 32 may generate the second gradient selection signal GRD_SEL<2> from the count code CNT_CD<1:3> and the third and fourth set codes SCD3<1:3> and SCD4<1:3> in response to the second selection control signal SEL2_EN and the temperature detection signal T_DETP. In one example, the second gradient selection signal GRD_SEL<2> may be enabled synchronously with a time that the count code CNT_CD<1:3> is the same as the third set code SCD3<1:3>. More specifically, the second selection signal generator 32 may compare the count code CNT_CD<1:3> with the third and fourth set codes SCD3<1:3> and SCD4<1:3> to generate the second internal signal (INI2 of FIG. 4) and may generate the second gradient selection signal GRD_SEL<2> based on the second internal signal INI2 in synchronization with the pulse of the temperature detection signal T_DETP while the second selection control signal SEL2_EN is enabled. Further, the first gradient selection signal GRD_SEL<1> may be disabled when the count code CNT_CD<1:3> is the same as the fourth set code SCD4<1:3>.

The third selection signal generator 33 may generate the third gradient selection signal GRD_SEL<3> in response to the first and second gradient selection signals GRD_SEL<1: 2>. More specifically, the third selection signal generator 33 may generate the third gradient selection signal GRD_SEL<3> disabled if at least one of the first and second gradient selection signals GRD_SEL<1:2> is enabled. Meanwhile, the third selection signal generator 33 may generate the third gradient selection signal GRD_SEL<3> enabled if both of the first and second gradient selection signals GRD_SEL<1:2> are disabled. Logic levels of enabled first, second and third gradient selection signals GRD_SEL<1:3> may be set differently according to the embodiments.

Figure 3:
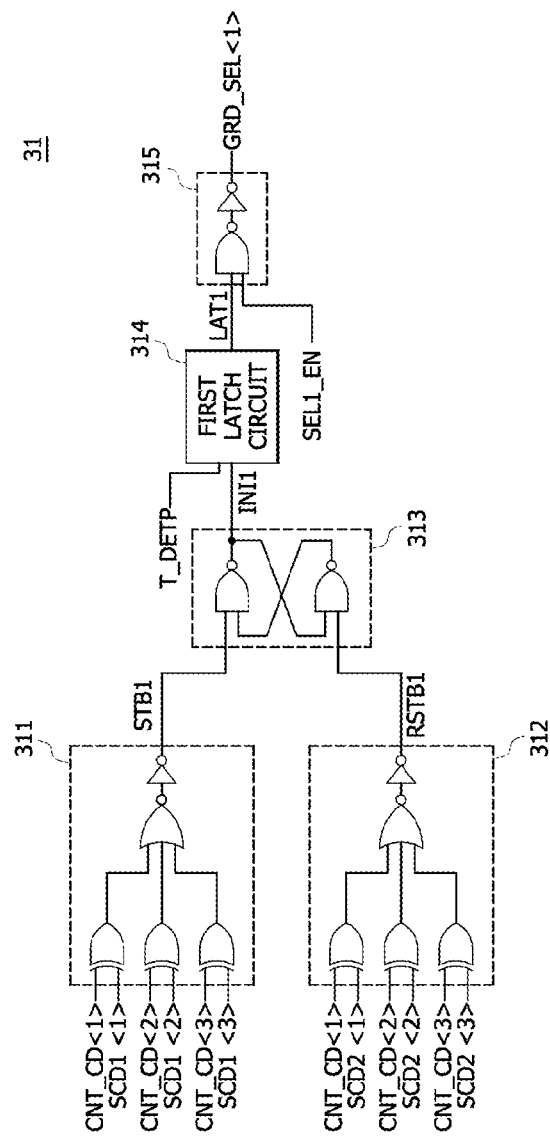
FIG. 3 is a block diagram illustrating a first selection signal generator included in the gradient control circuit of FIG. 2.

Referring to FIG. 3, the first selection signal generator 31 may include a first set signal generator 311, a first reset signal generator 312, a first internal signal generator 313, a first latch circuit 314 and a first buffer 315.

The first set signal generator 311 may generate a first set signal STB1 in response to the count code CNT_CD<1:3> and the first set code SCD1<1:3>. More specifically, the first set signal generator 311 may generate the first set signal STB1, enabled to a logic "low" level, if the count code CNT_CD<1:3> is the same as the first set code SCD1<1:3>. If the count code CNT_CD<1:3> and the first set code SCD1<1:3> are the same, this means that the count code CNT_CD<1> is the same as the first set code SCD1<1>, the count code CNT_CD<2> is the same as the first set code SCD1<2>, and the count code CNT_CD<3> is the same as the first set code SCD1<3>. A logic level of the enabled first set signal STB1 may be set different according to the embodiments.

The first reset signal generator 312 may generate a first reset signal RSTB1 in response to the count code CNT_CD<1:3> and the second set code SCD2<1:3>. More specifically, the first reset signal generator 312 may generate the first reset signal RSTB1, which is enabled to a logic "low" level, if the count code CNT_CD<1:3> is the same as the second set code SCD2<1:3>. If the count code CNT_CD<1:3> and the second set code SCD2<1:3> are the same, this means that the count code CNT_CD<1> is the same as the second set code SCD2<1>, the count code CNT_CD<2> is the same as the second set code SCD2<2>, and the count code CNT_CD<3> is the same as the second set code SCD2<3>. A logic level of the enabled first reset signal RSTB1 may be set different according to the embodiments.

The first internal signal generator 313 may generate the first internal signal INI1 in response to the first set signal STB1 and the first reset signal RSTB1. More specifically, the first internal signal generator 313 may generate the first internal signal INI1 enabled to a logic "high" level if the first set signal STB1 is enabled to a logic "low" level and may generate the first internal signal INI1 disabled to a logic "low" level if the first reset signal RSTB1 is enabled to a logic "low" level. A logic level of the enabled first internal signal INI1 may be set different according to the embodiments.

The first latch circuit 314 may generate a first latch signal LAT1 from the first internal signal INI1 in response to the temperature detection signal T_DETP. More specifically, the first latch circuit 314 may latch the first internal signal INI1 in response to the temperature detection signal T_DETP pulse created if a logic level combination of the sequentially counted count code CNT_CD<1:3> corresponds to the internal temperature of the semiconductor device and the first latch circuit 314 may output the latched first internal signal as the first latch signal LAT1.

The first buffer 315 may generate the first gradient selection signal GRD_SEL<1> from the first latch signal LAT1 in response to the first selection control signal SEL1_EN. More specifically, the first buffer 315 may buffer the first latch signal LAT1 to output the buffered first latch signal as the first gradient selection signal GRD_SEL<1> if the first selection control signal SEL1_EN is enabled to a logic "high" level.

The first selection signal generator 31 may generate the first internal signal INI1 enabled to a logic "high" level during a first temperature section from a time point that the sequentially counted count code CNT_CD<1:3> is the same as the first set code SCD1<1:3> till a time point that the sequentially counted count code CNT_CD<1:3> is the same as the second set code SCD2<1:3>. In addition, the first selection signal generator 31 may generate the first gradient selection signal GRD_SEL<1>, which is enabled to a logic "high" level, during the first temperature section if the first selection control signal SEL1_EN is enabled to a logic "high" level and the pulse of the temperature detection signal T_DETP is created.

Figure 4:
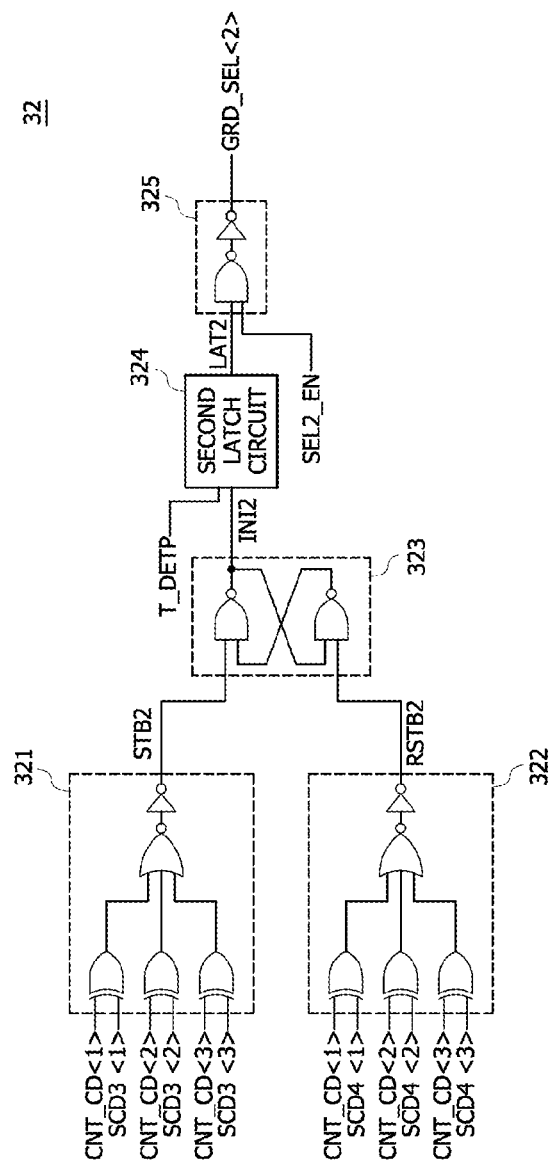
FIG. 4 is a block diagram illustrating a second selection signal generator included in the gradient control circuit of FIG. 2.

Referring to FIG. 4, the second selection signal generator 32 may include a second set signal generator 321, a second reset signal generator 322, a second internal signal generator 323, a second latch circuit 324 and a second buffer 325.

The second set signal generator 321 may generate a second set signal STB2 in response to the count code CNT_CD<1:3> and the third set code SCD3<1:3>. More specifically, the second set signal generator 321 may generate the second set signal STB2 which is enabled to a logic "low" level if the count code CNT_CD<1:3> is the same as the third set code SCD3<1:3>. The count code CNT_CD<1:3> being the same as the third set code SCD3<1:3> means that the count code CNT_CD<1> is the same as the third set code SCD3<1>, the count code CNT_CD<2> is the same as the third set code SCD3<2>, and the count code CNT_CD<3> is the same as the third set code SCD3<3>. A logic level of the enabled second set signal STB2 may be set to differently according to the embodiments.

The second reset signal generator 322 may generate a second reset signal RSTB2 in response to the count code CNT_CD<1:3> and the fourth set code SCD4<1:3>. More specifically, the second reset signal generator 322 may generate the second reset signal RSTB2 which is enabled to a logic "low" level if the count code CNT_CD<1:3> is the same as the fourth set code SCD4<1:3>. The count code CNT_CD<1:3> being the same as the fourth set code SCD4<1:3> means that the count code CNT_CD<1> is the same as the fourth set code SCD4<1>, the count code CNT_CD<2> is the same as the fourth set code SCD4<2>, and the count code CNT_CD<3> is the same as the fourth set code SCD4<3>. A logic level of the enabled second reset signal RSTB2 may be set differently according to the embodiments.

The second internal signal generator 323 may generate the second internal signal INI2 in response to the second set signal STB2 and the second reset signal RSTB2. More specifically, the second internal signal generator 323 may generate the second internal signal INI2 which is enabled to a logic "high" level if the second set signal STB2 is enabled to a logic "low" level, and the second internal signal generator 323 may generate the second internal signal INI2 which is disabled to a logic "low" level if the second reset signal RSTB2 is enabled to a logic "low" level. A logic level of the enabled second internal signal INI2 may be set differently according to the embodiments.

The second latch circuit 324 may generate a second latch signal LAT2 from the second internal signal INI2 in response to the temperature detection signal T_DETP. More specifically, the second latch circuit 324 may latch the second internal signal INI2 in response to the pulse of the temperature detection signal T_DETP and may output the latched second internal signal as the second latch signal LAT2. The temperature detection signal T_DETP may be created if a logic level combination of the sequentially counted count code CNT_CD<1:3> corresponds to the internal temperature of the semiconductor device.

The second buffer 325 may generate the second gradient selection signal GRD_SEL<2> from the second latch signal LAT2 in response to the second selection control signal SEL2_EN. More specifically, the second buffer 325 may buffer the second latch signal LAT2 to output the buffered second latch signal as the second gradient selection signal GRD_SEL<2> if the second selection control signal SEL2_EN is enabled to a logic "high" level.

The second selection signal generator 32 may generate the second internal signal INI2 which is enabled to a logic "high" level during a second temperature section from a time point that the sequentially counted count code CNT_CD<1:3> is the same as the third set code SCD3<1:3> till a time point that the sequentially counted count code CNT_CD<1:3> is the same as the fourth set code SCD4<1:3>. In addition, the second selection signal generator 32 may generate the second gradient selection signal GRD_SEL<2>, which is enabled to a logic "high" level, during the second temperature section if the second selection control signal SEL2_EN is enabled to a logic "high" level and the pulse of the temperature detection signal T_DETP is created.

Figure 5:
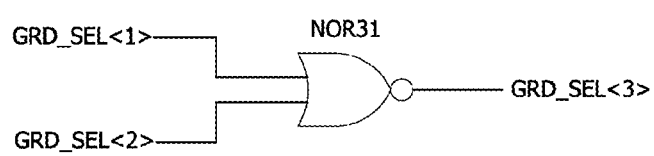
FIG. 5 is a logic circuit diagram illustrating a third selection signal generator included in the gradient control circuit of FIG. 2.

Referring to FIG. 5, the third selection signal generator 33 may include a NOR gate NOR31. The third selection signal generator 33 may generate the third gradient selection signal GRD_SEL<3> which is disabled to a logic "low" level if at least one of the first and second gradient selection signals GRD_SEL<1:2> is enabled to a logic "high" level. The third selection signal generator 33 may generate the third gradient selection signal GRD_SEL<3> enabled to a logic "high" level if both of the first and second gradient selection signals GRD_SEL<1:2> are disabled to a logic "low" level.

An operation of the semiconductor device having the aforementioned configuration will be described hereinafter with reference to FIGS. 6 to 10. In the following description, it may be assumed that the count code CNT_CD<1:3> inputted to the semiconductor device is sequentially counted from a logic level combination of '000' (corresponding to a decimal number '0') to a logic level combination of '111' (corresponding to a decimal number '7'). The decimal numbers '0', '1', '2', '3', '4', '5', '6' and '7' of the count code CNT_CD<1:3> may correspond to the internal temperatures 'T1', 'T2', 'T3', 'T4', 'T5', 'T6', 'T7' and 'T8' of the semiconductor device, respectively.

When the count code CNT_CD<1:3> inputted to the semiconductor device has the decimal numbers of '0', '1' and '2' (corresponding to logic level combinations of '000', '001' and '010'), the internal temperature of the semiconductor device may be within the range of a first temperature section (T1~T4). During the first temperature section (T1~T4), the first internal signal INI1 may be generated to have a logic "high" level and the second internal signal INI2 may be generated to have a logic "low" level. When the count code CNT_CD<1:3> inputted to the semiconductor device has the decimal numbers of '3', '4' and '5' (corresponding to logic level combinations of '011', '100' and '101'), the internal temperature of the semiconductor device may be within the range of a second temperature section (T4~T7). During the second temperature section (T4~T7), both of the first and second internal signals INI1 and INI2 may be generated to a logic "low" level. When the count code CNT_CD<1:3> inputted to the semiconductor device has the decimal numbers of '6', and '7' (corresponding to logic level combinations of '110' and '111'), the internal temperature of the semiconductor device may be within the range of a third temperature section (T7~T9). During the third temperature section (T7~T9), the first internal signal INI1 may be generated to a logic "low" level and the second internal signal INI2 may be generated to a logic "high" level.

Figure 6:
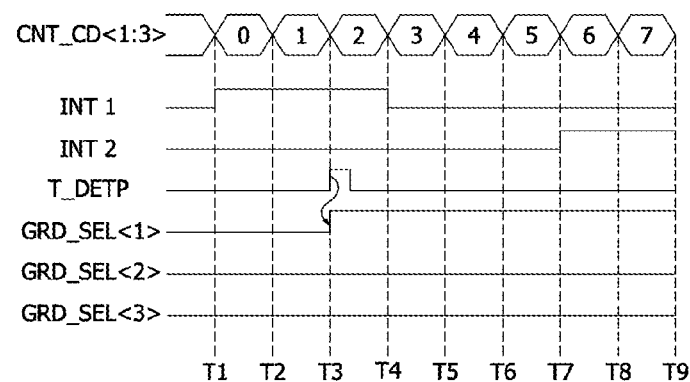
FIGS. 6, 7 and 8 are timing diagrams illustrating operations of the semiconductor device shown in FIGS. 1 to 5.

Referring to FIG. 6, if the internal temperature of the semiconductor device is a third temperature T3 within the range of the first temperature section (T1~T4), the temperature detection signal T_DETP may be generated to include a pulse created in synchronization with a time point that the count code CNT_CD<1:3> having a decimal number of '2' is inputted to the semiconductor device. In such a case, the first gradient selection signal GRD_SEL<1> may be enabled to a logic "high" level by the first internal signal INI1 having a logic "high" level and the pulse of the temperature detection signal T_DETP.

Figure 7:
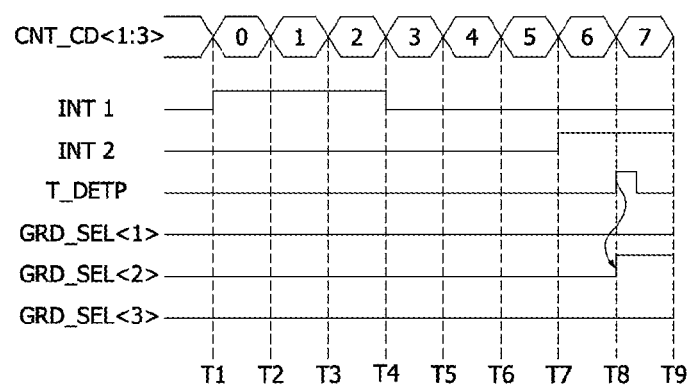

Referring to FIG. 7, if the internal temperature of the semiconductor device is an eighth temperature T8 within the range of the third temperature section (T7~T9), the temperature detection signal T_DETP may be generated to include a pulse created in synchronization with a time point that the count code CNT_CD<1:3> having a decimal number of '7' is inputted to the semiconductor device. In such a case, the second gradient selection signal GRD_SEL<2> may be enabled to a logic "high" level by the second internal signal INI2 having a logic "high" level and the pulse of the temperature detection signal T_DETP.

Figure 8:
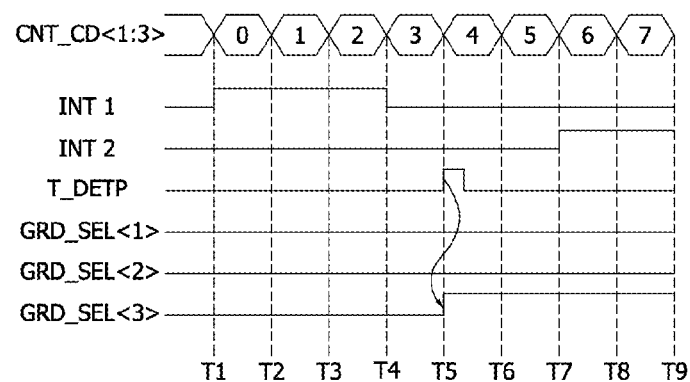

Referring to FIG. 8, if the internal temperature of the semiconductor device is a fifth temperature T5 within the range of the second temperature section (T4~T7), the temperature detection signal T_DETP may be generated to include a pulse created in synchronization with a time point that the count code CNT_CD<1:3> having a decimal number of '4' is inputted to the semiconductor device. In such a case, the third gradient selection signal GRD_SEL<3> may be enabled to a logic "high" level by the first and second internal signals INI1 and INI2 having a logic "high" level and the pulse of the temperature detection signal T_DETP.

Figure 9:
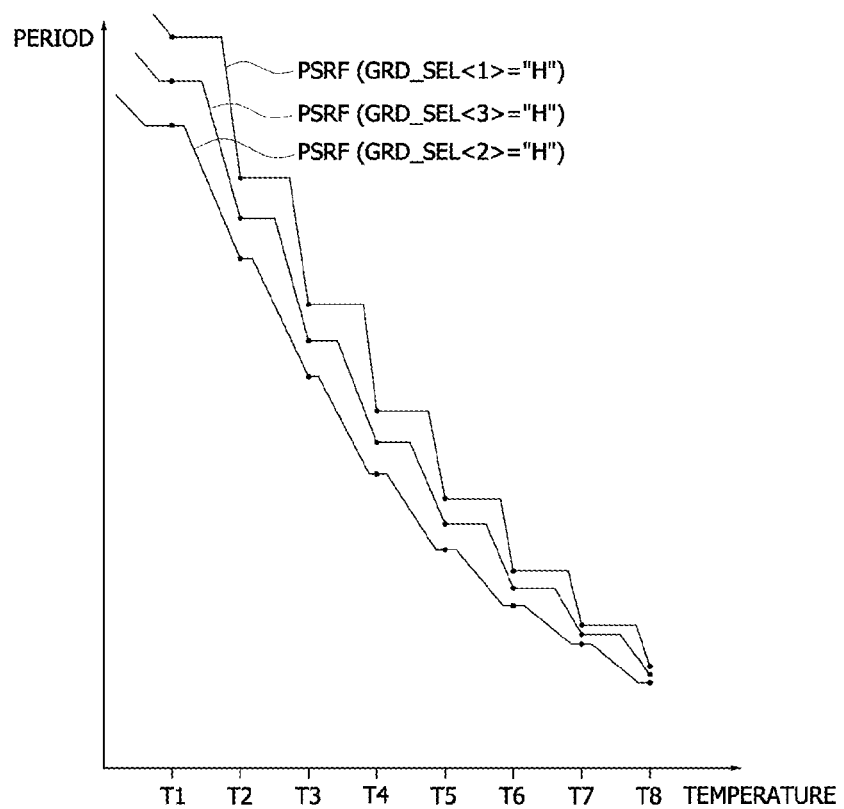
FIGS. 9 and 10 are graphs illustrating a temperature characteristic of a refresh signal having a gradient that varies according to an internal temperature of the semiconductor device.

Referring to FIG. 9, period variation rate of the refresh signal PSRF relative to a decrease (from the first temperature T1 to the eighth temperature T8) of the internal temperature of the semiconductor device is illustrated. The period variation of the refresh signal PSRF may occur when each of the first to third gradient selection signals GRD_SEL<1:3> is enabled to a logic "high" level. That is, a period of the refresh signal PSRF (i.e., a refresh cycle time) is reduced at the greatest rate if the first gradient selection signal GRD_SEL<1> is generated having a logic "high" level, and a period of the refresh signal PSRF (i.e., a refresh cycle time) is reduced at the least rate if the second gradient selection signal GRD_SEL<2> is generated having a logic "high" level.

Figure 10:
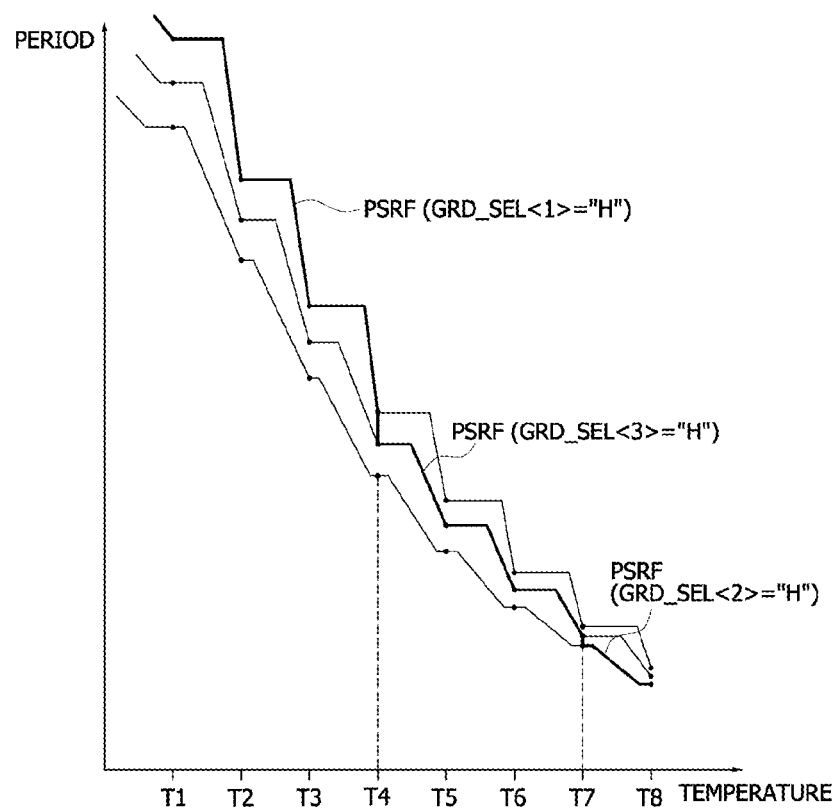

Referring to FIG. 10, period variation rate of the refresh signal PSRF relative to a decrease (from the first temperature T1 to the eighth temperature T8) of the internal temperature of the semiconductor device is illustrated according to the first to third temperature sections T1~T4, T4~T7 and T7~T9. That is, a period variation rate of the refresh signal PSRF lessens as the internal temperature of the semiconductor device decreases from the first temperature section T1~T4 toward the third temperature section T7~T9.

As described above, a semiconductor device according to an embodiment may generate a refresh signal which is capable of having different temperature gradients according to temperature sections. Thus, a period of the refresh signal may be set according to the temperature sections. In some embodiments, a period of a control signal for controlling various internal operations repeatedly executed in the semiconductor device may be set to temperature sections. The internal operations of the semiconductor device may include a read operation, a write operation and a pre-charge operation.

Figure 11:
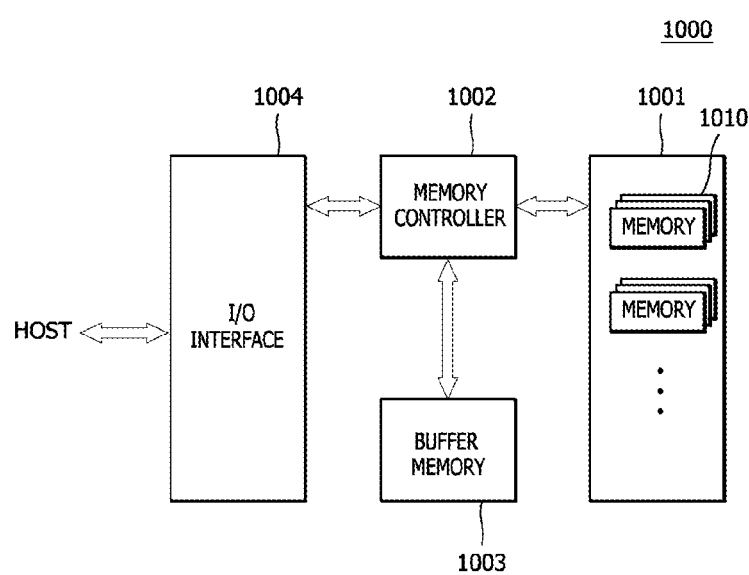
FIG. 11 is a block diagram illustrating an electronic system including the semiconductor device shown in FIGS. 1 to 10.

The semiconductor device described with reference to FIGS. 1 to 10 may be applied to an electronic system that includes a memory system, a graphic system, a computing system, a mobile system, or the like. For example, as illustrated in FIG. 11, an electronic system 1000 according an embodiment may include a data storage circuit 1001, a memory controller 1002, a buffer memory 1003, and an input/output (I/O) interface 1004.

The data storage circuit 1001 may store data which is outputted from the memory controller 1002 or may read and output the stored data to the memory controller 1002, according to a control signal generated from the memory controller 1002. The data storage circuit 1001 may include the semiconductor device illustrated in FIG. 1. Meanwhile, the data storage circuit 1001 may include a nonvolatile memory that can retain stored data even when its power supply is interrupted. The nonvolatile memory may be a flash memory such as a NOR-type flash memory or a NAND-type flash memory, a phase change random access memory (PRAM), a resistive random access memory (RRAM), a spin transfer torque random access memory (STTRAM), a magnetic random access memory (MRAM), or the like.

The memory controller 1002 may receive a command outputted from an external device (e.g., a host device) through the I/O interface 1004 and may decode the command outputted from the host device to control an operation for inputting data into the data storage circuit 1001 or the buffer memory 1003, or for outputting the data stored in the data storage circuit 1001 or the buffer memory 1003. Although FIG. 11 illustrates the memory controller 1002 as a single block, the memory controller 1002 may include one controller for controlling the data storage circuit 1001 comprised of a nonvolatile memory and another controller for controlling the buffer memory 1003 comprised of a volatile memory.

The buffer memory 1003 may temporarily store data processed by the memory controller 1002. That is, the buffer memory 1003 may temporarily store data outputted from or inputted to the data storage circuit 1001. The buffer memory 1003 may store the data, outputted from the memory controller 1002, according to a control signal. The buffer memory 1003 may read and output the stored data to the memory controller 1002. The buffer memory 1003 may include volatile memory such as a dynamic random access memory (DRAM), a mobile DRAM, or a static random access memory (SRAM).

The I/O interface 1004 may physically and electrically connect the memory controller 1002 to the external device (i.e., the host). Thus, the memory controller 1002 may receive control signals and data supplied from the external device (i.e., the host) through the I/O interface 1004 and may output the data generated from the memory controller 1002 to the external device (i.e., the host) through the I/O interface 1004. That is, the electronic system 1000 may communicate with the host through the I/O interface 1004. The I/O interface 1004 may include any one of various interface protocols such as a universal serial bus (USB), a multimedia card (MMC), a peripheral component interconnect-express (PCI-E), a serial attached SCSI (SAS), a serial AT attachment (SATA), a parallel AT attachment (PATA), a small computer system interface (SCSI), an enhanced small device interface (ESDI) and an integrated drive electronics (IDE).

The electronic system 1000 may be used as an auxiliary storage device of the host or an external storage device. The electronic system 1000 may include a solid state disk (SSD), a USB memory, a secure digital (SD) card, a mini secure digital (mSD) card, a micro secure digital (micro SD) card, a secure digital high capacity (SDHC) card, a memory stick card, a smart media (SM) card, a multi-media card (MMC), an embedded multi-media card (eMMC), a compact flash (CF) card, or the like.

What is claimed is:

1. A semiconductor device comprising:
   a temperature code latch circuit suitable for latching a count code having a logic level combination corresponding to an internal temperature to output the latched count code as a temperature code; and
   a period selection circuit suitable for selecting a period of a refresh signal in response to the temperature code,
   wherein a period variation rate of the refresh signal according to variation of the internal temperature is controlled by a first gradient selection signal during a first temperature section and is controlled by a second gradient selection signal during a second temperature section.

2. The semiconductor device of claim 1,
   wherein the count code is sequentially counted; and
   wherein a logic level combination of the sequentially counted count code corresponds to the internal temperature.

3. The semiconductor device of claim 1,
   wherein the count code is counted from a first logic level combination to a second logic level combination;
   wherein the first logic level combination corresponds to a first internal temperature; and
   wherein the second logic level combination corresponds to a second internal temperature.

4. The semiconductor device of claim 1, wherein the first temperature section is set to be higher than the second temperature section.

5. The semiconductor device of claim 1, wherein the period variation rate of the refresh signal according to variation of the internal temperature in the first temperature section is set to be greater than the period variation rate of the refresh signal according to variation of the internal temperature in the second temperature section.

6. The semiconductor device of claim 1, further comprising a temperature sensing circuit suitable for generating a temperature detection signal including a pulse which is created if the count code having a logic level combination corresponding to the internal temperature is inputted thereto.

7. The semiconductor device of claim 1, further comprising a gradient control circuit suitable for comparing the count code with first to fourth set codes to generate the first and second gradient selection signals, in response to a temperature detection signal, a first selection control signal and a second selection control signal.

8. The semiconductor device of claim 1, further comprising a first selection signal generator suitable for comparing the count code with first and second set codes to generate the first gradient selection signal, in response to a temperature detection signal and a first selection control signal.

9. The semiconductor device of claim 8,
wherein the first gradient selection signal is enabled in synchronization with a time point that the count code is the same as the first set code; and
wherein the first gradient selection signal is disabled in synchronization with a time point that the count code is the same as the second set code.

10. The semiconductor device of claim 8, further comprising a second selection signal generator suitable for comparing the count code with third and fourth set codes to generate the second gradient selection signal, in response to the temperature detection signal and a second selection control signal.

11. The semiconductor device of claim 10,
wherein the second gradient selection signal is enabled in synchronization with a time point that the count code is the same as the third set code; and
wherein the second gradient selection signal is disabled in synchronization with a time point that the count code is the same as the fourth set code.

12. The semiconductor device of claim 10, further comprising a third selection signal generator suitable for generating a third gradient selection signal in response to the first and second gradient selection signals.

13. The semiconductor device of claim 12, wherein the third gradient selection signal is disabled if at least one of the first and second gradient selection signals is enabled.

14. A semiconductor device comprising:
a gradient control circuit suitable for comparing a count code with first to fourth set codes to generate first and second gradient selection signals, in response to a temperature detection signal, a first selection control signal and a second selection control signal; and
a period selection circuit suitable for selecting a period of a refresh signal in response to a temperature code,
wherein a period variation rate of the refresh signal according to variation of an internal temperature is controlled by the first gradient selection signal in a first temperature section and is controlled by the second gradient selection signal in a second temperature section.

15. The semiconductor device of claim 14, wherein the temperature detection signal includes a pulse which is created if the count code has a logic level combination corresponding to the internal temperature.

16. The semiconductor device of claim 14,
wherein the count code is counted from a first logic level combination to a second logic level combination;
wherein the first logic level combination corresponds to a first internal temperature; and
wherein the second logic level combination corresponds to a second internal temperature.

17. The semiconductor device of claim 14, wherein the first temperature section is set to be higher than the second temperature section.

18. The semiconductor device of claim 14, wherein the gradient control circuit includes a first selection signal generator suitable for comparing the count code with the first and second set codes to generate the first gradient selection signal, in response to the temperature detection signal and the first selection control signal.

19. The semiconductor device of claim 18,
wherein the first gradient selection signal is enabled in synchronization with a time point that the count code is the same as the first set code; and
wherein the first gradient selection signal is disabled in synchronization with a time point that the count code is the same as the second set code.

20. The semiconductor device of claim 18, wherein the gradient control circuit further includes a second selection signal generator suitable for comparing the count code with the third and fourth set codes to generate the second gradient selection signal, in response to the temperature detection signal and the second selection control signal.

21. The semiconductor device of claim 20,
wherein the second gradient selection signal is enabled in synchronization with a time point that the count code is the same as the third set code; and
wherein the first gradient selection signal is disabled in synchronization with a time point that the count code is the same as the fourth set code.

22. The semiconductor device of claim 20, wherein the gradient control circuit further includes a third selection signal generator suitable for generating a third gradient selection signal in response to the first and second gradient selection signals.

23. The semiconductor device of claim 22, wherein the third gradient selection signal is disabled if at least one of the first and second gradient selection signals is enabled.

24. The semiconductor device of claim 14, wherein the period variation rate of the refresh signal according to variation of the internal temperature in the first temperature section is set to be greater than the period variation rate of the refresh signal according to variation of the internal temperature in second temperature section.

25. A semiconductor device comprising:
a temperature code latch circuit suitable for latching a count code having a logic level combination corresponding to an internal temperature to output the latched count code as a temperature code; and
a period selection circuit suitable for selecting a period of a control signal in response to the temperature code,
wherein a period variation rate of the control signal according to variation of the internal temperature is controlled by a first gradient selection signal in a first temperature section and is controlled by a second gradient selection signal during a second temperature section.

26. The semiconductor device of claim 25, wherein a period of the control signal is set to control an internal operation which is internally and repeatedly executed in the semiconductor device.

* * * * *